United States Patent [19]

Richman

[11] 4,335,502
[45] Jun. 22, 1982

[54] METHOD FOR MANUFACTURING METAL-OXIDE SILICON DEVICES

[75] Inventor: Paul Richman, St. James, N.Y.

[73] Assignee: Standard Microsystems Corporation, Hauppauge, N.Y.

[21] Appl. No.: 192,872

[22] Filed: Oct. 1, 1980

[51] Int. Cl.³ .................. H01L 21/22; H01L 21/283; H01L 21/308
[52] U.S. Cl. .......................... 29/571; 29/580; 29/590; 29/591; 148/187; 156/653; 156/657; 156/662
[58] Field of Search ........................ 156/657, 662, 653; 29/571, 580, 590, 591; 148/187

[56] References Cited
U.S. PATENT DOCUMENTS

| | | | |
|---|---|---|---|
| 3,752,711 | 8/1973 | Kooi et al. | 29/571 |
| 3,967,981 | 7/1976 | Yamazaki | 29/571 |
| 4,041,518 | 8/1977 | Shimizu et al. | 29/571 |
| 4,072,545 | 2/1978 | De La Moneda | 29/571 |
| 4,214,917 | 7/1980 | Clark et al. | 156/657 |
| 4,265,685 | 5/1981 | Seki | 156/657 |
| 4,277,881 | 7/1981 | Godejahn | 156/657 |
| 4,305,760 | 12/1981 | Trudel | 427/399 |
| 4,306,915 | 12/1981 | Shiba | 29/571 |

*Primary Examiner*—Jerome W. Massie
*Attorney, Agent, or Firm*—Hopgood, Calimafde, Kalil, Blaustein & Judlowe

[57] ABSTRACT

A metal-oxide-semiconductor (MOS) structure and method for its fabrication wherein all contact hole locations are simultaneously photolithographically defined in the gate oxide layer and openings are etched at these locations prior to the deposition of polysilicon, which is then etched to form interconnections and contacts. The completed structure contains a thick oxide layer which forms an insulating dielectric which surrounds and is self-aligned with the contact holes and obviates the need for the commonly used intermediate layer of phosphosilicate glass. The width of the polysilicon contacts to sources and drains is less than the width of the active channel formed in a conventional n-channel silicon gate Metal-Oxide-Silicon field-effect transistor so that significant misalignment in the channel length direction between the opening in the gate oxide at a contact hole location and the polysilicon pattern will not cause failure of individual field effect transistors (FETs). Thus, any non-etched gate oxide which remains under the polysilicon contacts will mask against diffusion of impurities, but will not block the flow of current between source and drain of the FET because the polysilicon source or drain contact does not extend across the entire channel width, thereby providing parallel current paths.

11 Claims, 11 Drawing Figures

METHOD FOR MANUFACTURING METAL-OXIDE SILICON DEVICES

BACKGROUND OF THE INVENTION

1. Field Of The Invention

This invention relates to metal-oxide-silicon (MOS) devices and, more particularly, to a technique for fabricating and the consequent structure of n-channel MOS field effect transistors (FETs) and integrated circuits.

2. Prior Art

Over the years, refinements in the design and manufacture of MOS field-effect transistors and integrated circuits have given rise to major advances in the packing density of the finished devices. Techniques such as silicon-gate technology, wherein the gate electrodes are self-aligned to the source and drain regions, ion implantation and self-aligned field-doped thick field locally oxidized n-channel technology (see U.S. Pat. No. 3,751,722) have contributed greatly to the improvement in device density. However, as device packing densities have increased, so has the need for self-aligned contact holes. In n-channel field-doped, locally-oxidized silicon-gate MOS integrated circuits, for example, it would be highly desirable to form contact holes which are self-aligned to both the individual polycrystalline silicon (polysilicon) regions and to diffused regions formed in the so-called mesa regions which result from the use of recessed oxide regions within the integrated circuit. Ideally, a processing sequence is required wherein the placement of contact hole locations is relatively unaffected by photolithographic misalignment so that no extra area trade-off is required to compensate for misalignment.

In conventional silicon-gate technology, particularly in the fabrication of n-channel silicon-gate MOS integrated circuits, phosphosilicate glass has found widespread use as an intermediate dielectric insulating layer for separating the metallization layer from underlying regions of polysilicon and diffused single crystal silicon. The phosphosilicate glass has the advantage of smoothing abrupt contours which result from variations in film thickness and contact hole edges.

This is a result of phosphosilicate glass' ability to be turned into a viscous fluid at temperatures above about 1,000° centigrade, thereby enabling it to "flow" over sharp polycrystalline silicon steps and dramatically improve the contour over which metalized interconnections will eventually run. The sharp contours would cause stress and cracks in the conductive metal films which electrically interconnect various parts of the device if the flowed phosphosilicate glass were not used.

There are, however, several disadvantages associated with the use of phosphosilicate glass. One such disadvantage is that it is chemically vapor deposited and, hence, is generally of non-uniform thickness and lower rupture strength than thermally grown silicon dioxide. This can be corrected by interposing a thin, thermally grown silicon dioxide layer between the underlying silicon and polysilicon layers and the phosphosilicate glass and subsequently etching oversized contact holes through this thin layer of silicon dioxide where desired. However, this procedure adds two additional steps to the manufacturing process. Another disadvantage associated with the use of phosphosilicate glass relates to its ability to react with water to form phosphoric acid which, in turn, can attack the aluminum metallization layer. Thus, moisture must be completely eliminated from the completed semiconductor device or significant reliability problems may result.

There have been attempts in the prior art to improve packing density, form self-aligned contact holes, and/or eliminate the use of phosphosilicate glass. One example was described by Muramoto et al. in a paper, entitled "A New Self-Aligning Contact Process for MOS/LSI" given at the 1978 International Electron Device Meeting in Washington, D.C. In this technique, an n-channel silicon-gate integrated circuit having a flat topology and high packing density is formed without the use of phosphosilicate glass. However, the manufacturing steps employed in this technique are extremely complex and the technique requires utilization of a new etching procedure called plasma-reactive sputter etching. In addition, other unconventional steps such as ion implantation through polysilicon and partial etching of thin layers of polysilicon are also required in this technique. The Muramoto et al technique requires a number of operations with manufacturing tolerances that would be difficult to meet in a production environment.

A simpler technique, which achieves relatively high packing density and avoids the use of phosphosilicate glass, is taught in Dingwall, U.S. Pat. No. 3,936,859. Dingwall teaches the use of silicon nitride to define the position of a silicon-gate structure and to protect the underlying polycrystalline silicon from oxidation. Since silicon nitride resists oxidation, it is possible to thermally grow thick local deposits of silicon dioxide around the gate in self-alignment with the gate edges. In Dingwall, however, only the contact hole to a gate electrode is self-aligned. No provision is made to simultaneously produce contact holes to enable subsequent high-density connections to single crystal diffused n+ regions.

Other approaches similar to Dingwall's are taught by V. L. Rideout et al in "MOSFETs With Polycrystalline Silicon-Gate Self-Aligned to the Field Isolation and to the Source/Drain Regions", 1976 International Electron Device Meeting, Section 24.1, Washington, D.C. and in "A One Device Memory Cell Using A Single Layer of Polysilicon And A Self-Registering Metal To Polysilicon Contact", 1977 International Electron Device Meeting, paper 13.2, Washington, D.C. Rideout et al also teaches the use of a layer of silicon nitride to prevent oxidation over the polysilicon gate and to reveal the entire gate area for contacting upon removal of the nitride. The structure taught by Rideout et al has the advantage of being doubly self-aligned because the polysilicon gate electrode is self-aligned on its ends with respect to the conductive source and drain regions and is also self-aligned on its sides with respect to the non-conductive field oxide isolation regions. However, as in Dingwall, the Rideout et al structure provides only for self-aligned contacts to the gate electrode while any contacts to single-crystal n+ diffused regions must be formed separately and are not self-aligned.

SUMMARY OF THE INVENTION

Accordingly, it is an object of the invention to form self-aligned contact holes in a high density integrated circuit so that the placement of such contact holes is tolerant of photolithographic misalignments, thereby obviating the need for extra area trade-off.

Another object of the invention is to produce a structure with a relatively flat topology and thereby eliminate the need for an intermediate layer of phosphosilicate glass.

It is a further object of the invention to form self-aligned contact holes between metallic interconnections and polysilicon gates and interconnections as well as between metallic interconnections and single crystal n+ diffused regions.

These features are obtained in a structure produced by a process which is characterized by simultaneously etching openings in the gate oxide to define both polysilicon-to-single crystal n+ contact hole locations and direct contact hole locations contacting metal to single crystal n+ diffused silicon. Thus, gate oxide remains only over those portions which are to become the gate electrodes of active devices. Subsequently, a relatively thick layer of polysilicon is deposited and selectively patterned with an oxidation-retardant masking layer to define the gate, source and drain electrodes, and polycrystalline interconnections, as well as the areas where all contact holes will eventually be located. The remaining polysilicon then masks removal of any exposed gate oxide. The oxidation retardant mask is removed from the polysilicon except in those locations where contact windows are desired for direct metallic contact to n+ diffused single crystal; polysilicon-to-n+ diffused single crystal; and direct metal to polysilicon. A subsequent heavy implantation or diffusion dopes all locations except the contact hole locations, thereby forming single crystal n+ diffused regions at the source and drain, n+ diffused single crystal silicon regions, and n+ diffused polysilicon interconnection regions. A thick layer of silicon dioxide is thermally grown over the entire surface except at the oxidation-retardant protected contact hole locations. During this oxidation step, approximately one half of the polysilicon material which is not covered by the oxidation-retardant material is converted to silicon dioxide. The removal of the remaining silicon nitride permits self-aligned contacts with tapered sidewalls to be produced without the need for an intermediate phosphosilicate glass insulating layer.

The width of polysilicon regions intended to contact the sources or drains, in the channel width direction, must be made smaller than the width of the active channel region of the metal-oxide silicon device to enable the formation of electrical current paths which allow current to flow around any portion of a source or drain region that remains electrically nonconductive as a result of its not being doped during the previous diffusion or implantation step caused by gate oxide disposed between such a polysilicon region and the underlying portion of the source or drain it is intended to contact.

Comprehension of these and other objects, features and advantages of the invention will be facilitated by reading the following detailed description in conjunction with the accompanying drawings.

DRAWING DESCRIPTION

DETAILED DESCRIPTION

Figure 1A:
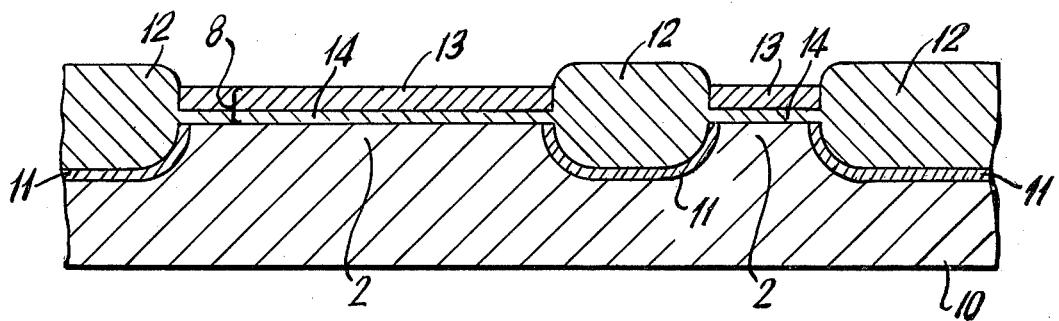
FIGS. 1A-1G illustrate successive steps in the fabrication of the structure of FIG. 2 in accordance with the invention.
Figure 1B:
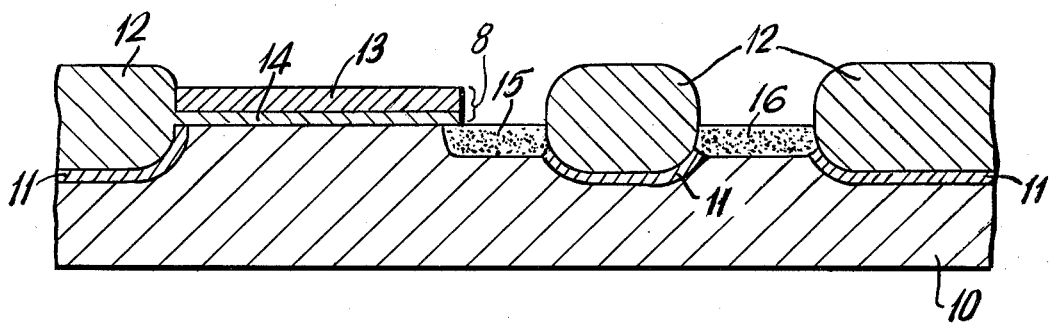
Figure 1C:
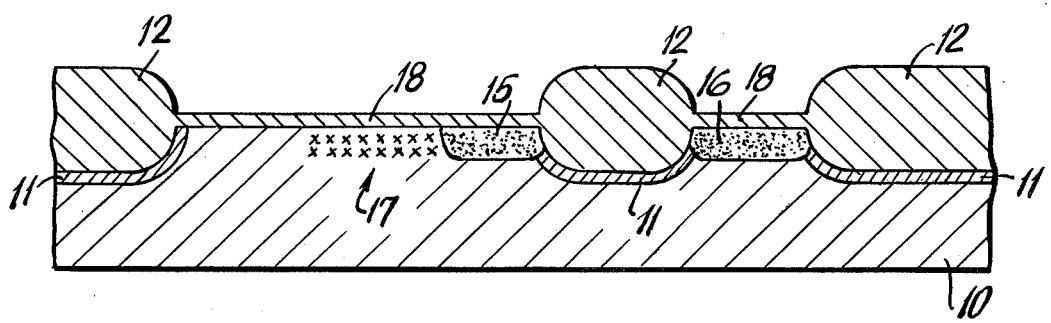
Figure 1D:
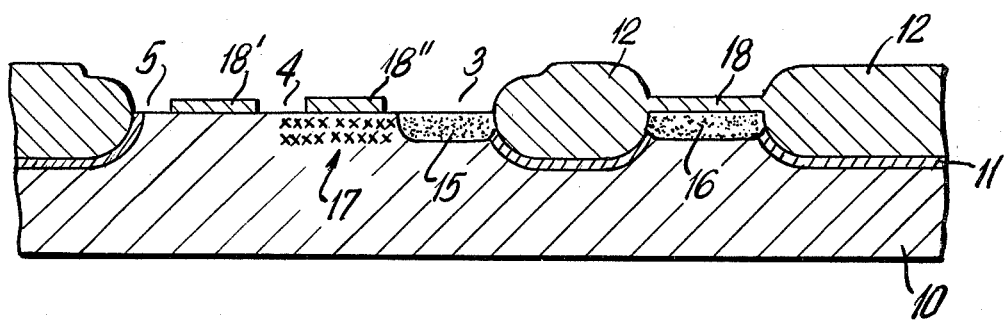
Figure 1E:
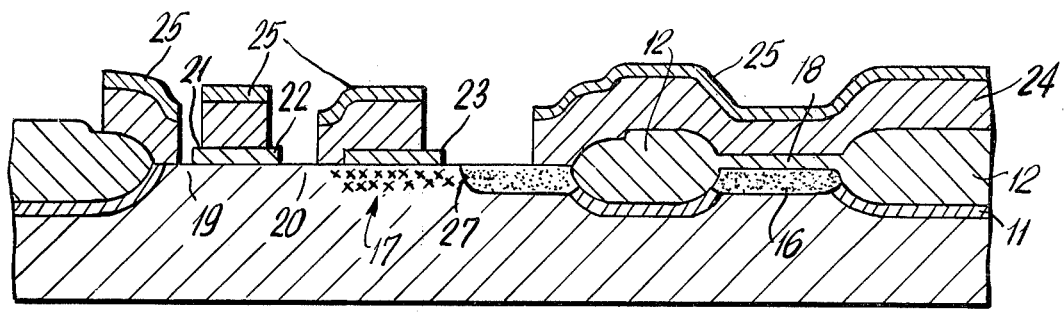
Figure 1F:
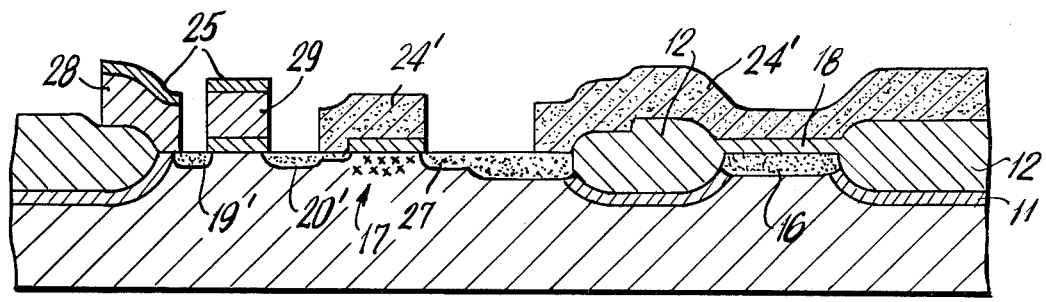
Figure 1G:
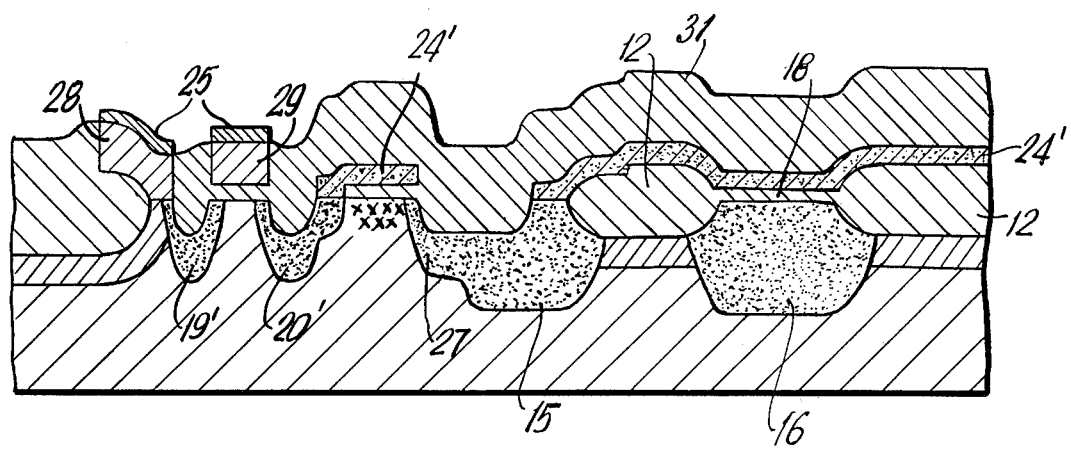
Figure 2:
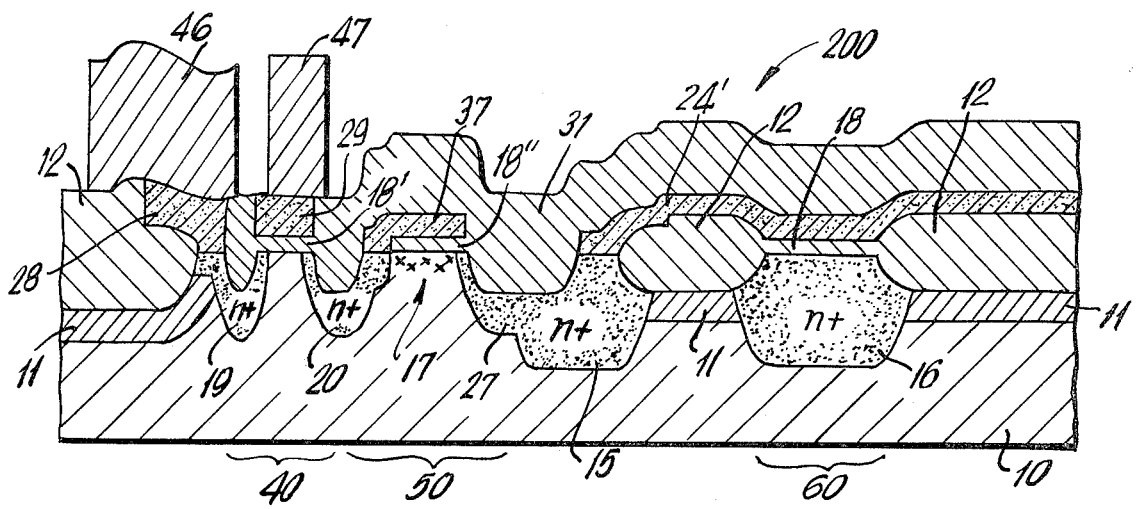
FIG. 2 is a cross-sectional view of an MOS structure made in accordance with the invention.

FIGS. 1A-1G show successive cross-sectional views of a wafer during processing to produce the structure shown in FIG. 2. The n-channel MOS integrated circuit structure 200 illustrated in FIG. 2 includes an MOS inverter, which comprises an enhancement-mode active MOSFET switching element 40, and a depletion-mode MOSFET load element 50. Drain 20 (which is also the source of MOSFET 50) of MOSFET 40 is connected in common with the gate 37 of MOSFET 50. The circuit structure 200 further includes an n+ cross-under 60 which is separated from a polysilicon layer 24' by a thin oxide 18.

Referring to FIG. 1A, mesa-like regions 2 are formed in the top surface of a silicon substrate 10 by the use of localized oxidation. Selective doping of the surface of silicon substrate 10 is also employed, as described in previously mentioned U.S. Pat. No. 3,751,722, so as to produce p-type regions 11 under the thick silicon dioxide regions 12. Illustratively, substrate 10 is 5 to 10 ohm-cm (1-0-0)-oriented p-type silicon. In order to form the mesa-like regions, substrate 10 is chemically cleaned prior to deposition of a dielectric mask 8 comprising a thin silicon dioxide layer 14 (500-1200 angstroms) and an overlying layer of silicon nitride 13. The silicon dioxide-silicon nitride masking layer 8 is patterned photolithographically and etched. The remaining portions of masking layer 8 will protect the active mesa-like regions from the effects of low level p-type diffusion or implantation in parasitic regions and will resist oxidation during subsequent thick field oxidation. The silicon nitride layer 13 may be formed by, for instance, decomposition of silicon tetrachloride in ammonia at a temperature of approximately 850° C. Silicon dioxide layer 14 acts as a stress relief barrier between substrate 10 and silicon nitride layer 13. A thin layer of siicon dioxide (not shown) may be pyrolytically deposited or thermally grown in oxygen over silicon nitride layer 13 in order to facilitate photoresist adhesion for the patterning and etching of masking layer 8.

The initial photolithographic operations, the results of which are shown in FIG. 1A, leave a silicon dioxide-silicon nitride sandwich 8 only over those regions that will, by subsequent process steps, be formed into sources, drains, channel regions, or diffused interconnections (active regions). Using a photoresist pattern as a mask, preselected areas of the silicon dioxide-silicon nitride sandwich are etched away using either chemical or plasma etching techniques. Next, p-type regions 11 are formed by implanting boron atoms into the top surface of silicon substrate 10 in areas that are not covered by the remaining areas of masking layer 8. The remaining photoresist is then removed in a conventional manner. A short period, high-temperature drive-in cycle is used to diffuse a controlled amount of boron deeper into the surface of the substrate in the areas into which the boron has been implanted.

The non-masked doped field regions are subsequently subjected to localized thermal oxidation in wet oxygen at a temperature of 975° C. Approximately 10,000 angstroms of thick-field oxide 12 are formed as the silicon is consumed. This operation also drives the boron-doped p-type regions 11 deeper into the substrate 10 as the thick-field regions of oxide 12 are grown. The lower surface of the oxide 12 is disposed approximately 4,500 angstroms below the original surface of the silicon substrate. The thermal oxidation process also converts a few hundred angstroms of the silicon nitride into silicon dioxide.

At this point, an optional n+ diffusion step may be performed to produce an additional interconnection layer which may be advantageously employed to pass under certain contact hole locations. Referring to FIG. 2, section 60 is an n+ diffused cross-under which can be realized through the use of a diffusion step at this point. The n+ diffused region 60 of FIG. 2 corresponds to region 16 of FIG. 1B. FIG. 1B shows a cross section of a wafer which has been subjected to the optional n+ diffusion step. The silicon dioxide-silicon nitride oxidation mask 8 remaining from the field-doped, local oxidation step shown in FIG. 1A may be again patterned photolithographically, selectively etched and thereby partially removed and the remainder used as a diffusion mask for the optional diffusion step. Exposed regions 15 and 16 of FIG. 1 are doped n-type with phosphorous or arsenic at a high temperature (1000° to 1100° C.). Now, the remaining silicon nitride-silicon dioxide mask 8 may be removed with hot phosphoric acid and buffered oxide etchant.

FIG. 1C shows the device of FIG. 1B from which mask 8 has been completely removed, followed by the thermal growth of a thin gate oxide layer 18 (about 1000 angstroms or less). Moreover, the figure shows the results of an optional step which will enable modification of the threshold voltage characteristic of a preselected portion of the surface of the substrate to form the depletion-mode MOSFET, which is shown generally in section 50 of FIG. 2. The realization of depletion-mode MOSFET 50 is achieved by the implantation of an n-type channel region 17 into the top surface of a selected portion of silicon substrate 10, as shown in FIG. 1C. Standard photolithographic techniques are used to form ion-implanted region 17 using the patterned photoresist as a mask beneath the area where the gate structure for depletion-mode MOSFET 50 is to be formed by subsequent process steps which will be described below. Oxide layer 18 is masked with photoresist (not shown) except over channel region 17 of depletion-mode MOSFET 50. Ion-implantation of n-type impurities through the portions of oxide layer 18 not covered with photoresist results in a lightly doped n-type channel 17, which modifies the threshold voltage associated with the gate region in order to form such a depletion-mode device.

Referring to FIG. 1D, gate oxide layer 18 shown in FIG. 1C is coated with photoresist, selectively patterned, and the resist is employed as a mask to etch a plurality of openings in the gate oxide. Those portions of gate oxide layer 18 which are to be gate insulators 18' and 18" remain. If an optional n+ diffused cross-under beneath polysilicon is desired, a preselected portion of gate oxide 18 is permitted to remain so that the two conducting elements will not short circuit to one another. This is shown by regions 16 and 24' in cross-under 60 shown in FIG. 2. In addition to defining the polycrystalline-to-single crystal n+ contact holes as in conventional procedures, the locations at which direct contact holes contacting metal to single crystal n+ diffused silicon may also be defined during this photolithographic operation.

Referring now to FIG. 1E, a thick (5,000–12,000 angstroms) polysilicon layer 24 is deposited over the surface of the structure of FIG. 1D. Polysilicon layer 24 is covered with a layer of silicon nitride 25. Alternatively, an oxidation-retardant metal such as platinum may be used in lieu of silicon nitride. Preferably, polysilicon layer 24 should be arsenic doped either during or directly after its deposition. Silicon nitride 25 is subsequently patterned photolithographically and used as a mask to etch away the unwanted portions of polysilicon layer 24 over the source and drain regions 19, 20, and 27 of the MOSFET devices. After the polysilicon etching step, the wafer appears as illustrated in FIG. 1E. Polysilicon layer 24 and silicon nitride layer 25 are then used as a mask to etch the exposed portions of the gate oxide shown as areas 21, 22, and 23.

Referring to FIG. 1F, portions of silicon nitride layer 25, which were shown in FIG. 1E, are now selectively removed by chemical or plasma etching or by ion milling so that the polysilicon 24 remains covered by silicon nitride only over preselected areas where contact holes are desired, e.g., direct metal to n+ diffused single crystal contacts, polysilicon to n+ diffused single crystal contacts and direct metal to polysilicon contacts. Thus, in FIG. 1F, silicon nitride masking layer 25 remains only over those locations where contact holes are desired, i.e., in this illustrative case, over the polysilicon contacing drain and gate electrodes 28 and 29, respectively, of the enhancement-type MOSFET. Known diffusion or ion implantation techniques are used to dope source, drain, and single crystal n+ silicon interconnection regions while also ,oping the uncovered portion of the polysilicon region to form doped polysilicon regions 24', which are stippled and cross-hatched in FIG. 1F.

FIG. 1G shows the results of a thermal oxidation step which is carried out to oxidize doped polysilicon regions 24' approximately halfway through, thus forming a layer of silicon dioxide 31 of approximately 5,000 to 12,000 angstroms in thickness overlying the doped polycrystalline silicon region 24'. A comparable amount of silicon dioxide is also formed over the single crystal n+ diffused silicon regions 19', 20', and 27. The polysilicon regions at the contact hole locations remain unaffected due to the presence of the overlying silicon nitride 25. The oxidation-resistant silicon nitride permits a relatively thick insulating coating of field oxide 31 to be formed without creating a large step or surface discontinuity which would cause cracking of the metallization and consequential reduction of yield. In fact, because of the kinetics of the oxidation process, the sidewalls of the thick oxide surrounding the edges of the silicon nitride at contact hole locations are not sharp, but rounded in nature. Thus, the need for topological contour-smoothing phosphosilicate glass is obviated. The process has the further advantage of virtually eliminating the preferential aluminum alloying along grain boundaries known as aluminum spiking by providing an n-doped polysilicon spiking barrier at all contact locations and, in particular, between the metal and the n+ diffused single crystal silicon regions. Aluminum spiking normally occurs at shallow p-n junctions formed on (1-0-0) oriented silicon substrates during the high temperature metal alloy. It should be noted that the implanted n+ regions 15, 16, 19', 20', and 27 have increased in junction depth relative to that of intermediate structures due to the elevated temperature used during the processing of the wafer, in particular, the thermal oxidation.

Silicon nitride layer 25, which protects the metal contact holes, is removed and all polysilicon regions thus exposed, such as regions 28 and 29, are diffused with phosphorous as shown stippled and cross-hatched in FIG. 2. If an oxidation-retardant refractory metal such as platinum were used instead of silicon nitride, the platinum may be left in place since the phosphorous diffusion serves only to improve the adhesion of the subsequent metallization. A metal layer such as aluminum-silicon or pure aluminum is deposited over the entire surface of the wafer. The metallization pattern is defined and etched by standard photolithographic techniques to form metal contacts 46 and 47 shown in the completed device of FIG. 2. The metal is then alloyed in hydrogen at a temperature of about 450° C. for 30 minutes. Typically, a passivating dielectric layer, which may comprise approximately 5000 angstroms of pyrolytically deposited silicon dioxide or silicon nitride (not shown), may be deposited over the entire surface. Via windows over the bonding pad areas are then defined and etched out.

Figure 3A:
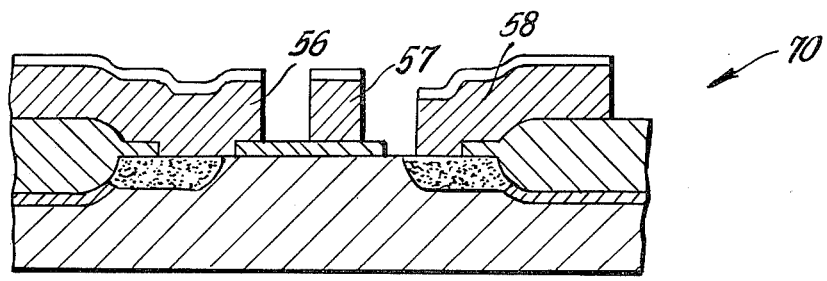
FIGS. 3A and 3B are cross-sectional views of an individual MOSFET device formed in accordance with the invention under conditions of imperfect alignment between the photolithographic operation defining the openings in the gate oxide and the photolithographic operation defining the polysilicon pattern.
Figure 3B:
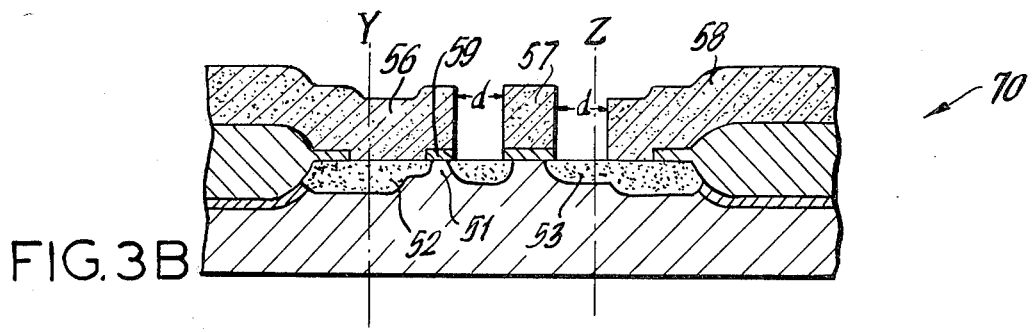

FIGS. 1E and 1F illustrate the ideal case of perfect alignment between the photolithographic operation in which openings are defined and etched in the gate oxide layer and the photolithographic operation in which the polysilicon layer is defined and etched. FIGS. 3A and 3B depict an individual MOSFET 70 during processing steps corresponding to those shown in FIGS. 1E and 1F, respectively. FIG. 3B shows the result of significant misalignment between the gate oxide photolithographic step (FIG. 1D) and the polysilicon photolithographic step (FIG. 1E). More particularly, FIG. 3B shows the structural effect of such misalignment after the gate oxide is etched for the second time, using polysilicon layers 56 and 57 as a mask, corresponding to the step of the process shown in FIG. 1F. A portion of the surface of substrate 10, shown as p-type region 51, remains undoped, and therefore partially blocks the flow of current between source 52 and drain 53 of MOSFET 70. Undoped portion 51 is the result of portion 59 of the gate oxide which was not removed during the second etching of the gate oxide and, therefore, remains as a mask preventing implantation or diffusion. The polysilicon layer contacting either the source or drain of the MOSFET can cover a portion of the gate oxide, depending upon the direction of the misalignment.

Figure 4:
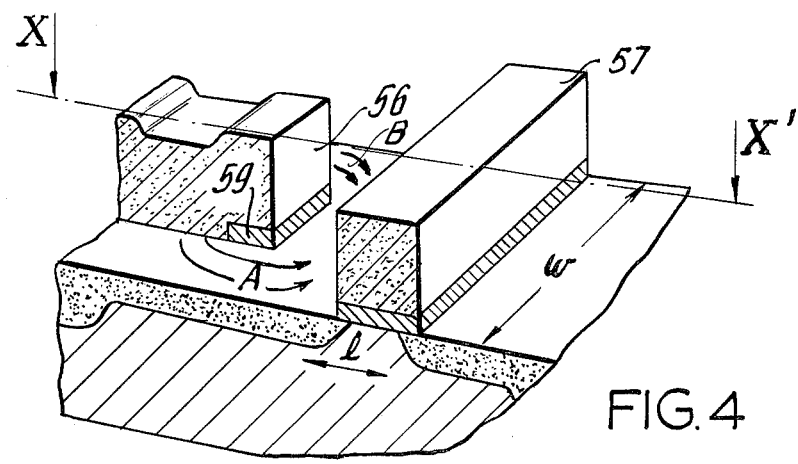
FIG. 4 is a three-dimensional view of the MOSFET structure of FIG. 3B.

High yield integrated circuits can be manufactured on a production line basis in accordance with the inventive concept outlined above by compensating for the effects of misalignment in the third dimension, i.e., along the channel width. The n-channel silicon gate MOS device shown in FIG. 2 is manufactured in an array so that individual devices are formed on mesa-like channels of width w. FIGS. 3A and 3B are cross-sectional representations taken lengthwise along a channel along line X—X', and FIG. 4 is a three-dimensional view of the portion of MOSFET 70 lying between lines Y and Z of FIG. 3B. Referring now to FIG. 4, the final width of polysilicon drain contact 56 is made to be less than the final channel width w of the device. A non-diffused p-region, such as region 51 of FIG. 3B, will not block the flow of current in the channel length (X—X') direction, because remaining oxide 59 will not mask and thereby will not prevent n+ implantation or diffusion across the entire channel width w. Thus, a parallel current path such as shown by arrows A and B in FIG. 4 will exist, enabling current to flow around undoped portion 51 and, therefore, directly between source 52 and drain 53 so as to ensure that the device will be functional. In order to achieve high device density, the distance d between respective polysilicon contacts 56 and 58, and polysilicon gate electrode 57 in FIG. 3B, should, preferably, be 5 micrometers or less, as measured in the channel length direction.

It is to be understood that the above-described examples are merely illustrative of the many possible specific embodiments which can be devised to represent application of the principles of the invention. Numerous and various arrangements can be devised with these principles by those skilled in the art without departing from the spirit and scope of the invention. For example, the process would also be applicable to the manufacture of p-channel devices and complementary MOS devices.

What is claimed is:

1. A process for fabricating an MOS structure comprising the steps of:
    (a) forming mesa-like regions of predetermined width for the active regions of a circuit on the surface of a silicon substrate of a first conductivity type by growing thick field oxide regions which extend above and below the top surface of said mesa-like regions;
    (b) forming a thin oxide layer over the surface of said mesa-like regions;
    (c) etching said thin oxide layer so as to form openings in said thin oxide layer to expose said silicon substrate;
    (d) forming a thick polysilicon layer over the entire surface of the structure resulting from step (c);
    (e) depositing a layer of oxidation-retardant material on said polysilicon layer;
    (f) etching said oxidation-retardant material and said polysilicon layer to expose preselected areas of said silicon substrate where sources, drains and diffused single crystal silicon interconnections are desired, but leaving said oxidation-retardant material at all such locations where contact holes are desired to the gates, sources, drains, and diffused interconnections;
    (g) etching away any exposed portions of said thin oxide layer using the oxidation-retardant material protected polysilicon as a mask;
    (h) etching away said oxidation-retardant material in selective locations exclusive of said contact hole locations;
    (i) using said oxidation-retardant material as a mask, doping exposed portions of said polysilicon layer and said silicon substrate with impurities of a second conductivity type to form at least one single crystal diffused portion on said silicon substrate; and
    (j) growing a thick insulating oxide layer which extends above and below portions of the top surfaces of all polysilicon regions and top surfaces of said mesa-like regions where a contact hole is not desired, said thick insulating oxide layer forming a relatively flat top surface.

2. The process of claim 1, wherein the oxidation-retardant material of step (e) is platinum.

3. The process of claim 1, wherein the oxidation-retardant material of step (e) is silicon nitride, the process further comprising the steps of:
    (k) removing said oxidation-retardant material from the locations where a contact hole is desired; and
    (l) doping the polysilicon exposed by removal of said oxidation-retardant material with phosphorus.

4. The process of claims 2 or 3, wherein there is further provided the step of depositing metallic material on the portions of the substrate where a metal contact is desired.

5. The process of claim 1, wherein said polysilicon layer is etched to produce regions of polysilicon of a width equal to or greater than the width of said mesa-like regions where gates are desired, and wherein said polysilicon layer is etched to produce other regions of polysilicon of widths which are less than the width of said mesa-like regions where such other polysilicon regions are desired to engage in electrical contact with preselected ones of the sources and drains.

6. The process of claim 1 wherein said openings in step (c) define all contact holes to preselected ones of said single crystal diffused portions of said silicon substrate.

7. The process of claim 1 wherein step (j) comprises thermally oxidizing the wafer structure produced in step (i), said thick insulating oxide layer having a thickness ranging from approximately 5000 Å to 12,000 Å.

8. The process of claim 1 wherein said polysilicon layer is doped with impurities of a second conductivity type prior to performing step (e), said polysilicon having a thickness ranging from approximately 5000 Å to 12,000 Å.

9. A process for fabricating an MOS structure comprising the steps of:
(a) forming mesa-like regions of predetermined width for the active regions of a circuit on the surface of a silicon substrate of a first conductivity type by growing thick field oxide regions which extend above and below the top surface of said mesa-like regions;
(b) forming a thin oxide layer over the surface of said mesa-like regions;
(c) etching said thin oxide layer to define a plurality of contact holes for direct metal to single crystal diffused silicon contact, and for polysilicon to single crystal diffused silicon contact;
(d) forming a thick polysilicon layer over the entire surface of the structure resulting from step (c), said thick polysilicon layer being doped with impurities of a second conductivity type;
(e) depositing an oxidation-retardant material on said polysilicon layer;
(f) etching said oxidation-retardant material and underlying polysilicon layer to expose preselected areas of said silicon substrate where sources, drains, and diffused single crystal silicon interconnections are desired, but leaving said oxidation-retardant material at all such locations where contact holes are desired to the gates, sources, drains, and diffused interconnections, said etched polysilicon layer having regions of width equal to or greater than the width of said mesa-like regions where a gate electrode is desired and other regions of width which is less than the width of said mesa-like regions where said polysilicon makes electrical contact to preselected ones of the sources and drains;
(g) etching away any exposed portions of said thin oxide layer using the oxidation-retardant material protected-polysilicon as a mask;
(h) selectively etching away said oxidation-retardant material from all locations exclusive of contact hole locations for a selectable combination of direct metal to polysilicon contact, a direct metal to single crystal diffused silicon contact, and a polysilicon to single crystal diffused silicon contact;
(i) using said oxidation-retardant material as a mask, doping exposed portions of said polysilicon layer and said silicon substrate with impurities of a second conductivity type; and
(j) growing a thick insulating oxide layer which extends above and below portions of the top surface of the structure formed in step (i) except in the contact hole locations which are protected by said oxidation-retardant material, said thick insulating oxide forming a relatively flat top surface.

10. The process of claim 9 wherein said thick insulating oxide layer is thermally grown and has a thickness ranging from approximately 5,000 Å to 12,000 Å.

11. The process of claim 9 further comprising the steps of:
(k) removing said oxidation-retardant material from said contact hole locations; and
(l) depositing metallic material at said contact hole locations.

* * * * *